United States Patent [19]

Goerne et al.

[11] Patent Number: 4,485,311
[45] Date of Patent: Nov. 27, 1984

[54] DRIVE CIRCUIT FOR AT LEAST ONE LIGHT-EMITTING DIODE

[75] Inventors: Jan Goerne; Wilfried Traulsen, both of Munich, Fed. Rep. of Germany

[73] Assignee: Siemens Aktiengesellschaft, Berlin & Munich, Fed. Rep. of Germany

[21] Appl. No.: 385,032

[22] Filed: Jun. 4, 1982

[30] Foreign Application Priority Data

Jul. 15, 1981 [DE] Fed. Rep. of Germany ....... 3128013

[51] Int. Cl.$^3$ .......................... H03K 3/42; H03K 3/26
[52] U.S. Cl. .................................. 307/270; 307/254; 307/311
[58] Field of Search ...................... 307/311, 270, 254; 328/2; 250/214

[56] References Cited

U.S. PATENT DOCUMENTS

| | | | |
|---|---|---|---|
| 3,648,073 | 3/1972 | Sams et al. | 307/311 |
| 3,867,580 | 2/1975 | Russel | 307/311 |
| 4,278,900 | 7/1981 | Kapadia et al. | 307/311 |
| 4,388,527 | 6/1983 | Fukuyama et al. | 307/311 |

FOREIGN PATENT DOCUMENTS 2850044 10/1979 Fed. Rep. of Germany .

*Primary Examiner*—Stanley D. Miller
*Assistant Examiner*—B. P. Davis
*Attorney, Agent, or Firm*—Hill, Van Santen, Steadman & Simpson

[57] ABSTRACT

A series connection consisting of a diode and one of two transistors of a transistor push-pull circuit is connected in parallel to the feed current path for a light-emitting diode and a capacitor is interconnected between the junction of the push-pull transistors and the junction between the light-emitting diode and an additional diode which is present in the feed current path. When the transistor in the series connection is in a blocking state, the light-emitting diode receives feed current and is thus switched to a light-emitting state. The capacitor causes a current pulse to be superimposed on the feed current during switchover for rapidly driving the light-emitting diode by decreasing the time span required by the light-emitting diode to reach a condition of maximum light emission.

2 Claims, 1 Drawing Figure

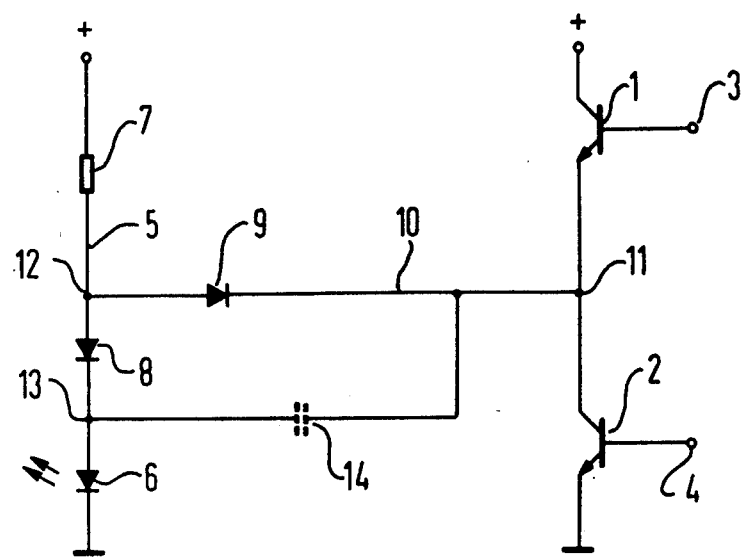

DRIVE CIRCUIT FOR AT LEAST ONE LIGHT-EMITTING DIODE

BACKGROUND OF THE INVENTION

1. Field of the Invention

The present invention relates to a drive circuit for at least one light-emitting diode, and in particular to such a drive circuit wherein the light-emitting diode is connected in a feed circuit which is driven via a connecting line by a transistor push-pull circuit.

2. Description of the Prior Art

A drive circuit for a light-emitting diode utilizing a transistor push-pull circuit connected to the light-emitting diode via a connecting line consisting of a resistor and a capacitor connected in parallel is known from German AS No. 28 50 044. Depending upon which of the two transistors in the push-pull circuit is blocking or conducting, the light-emitting diode is either short-circuited or receives additional feed current from the push-pull circuit. In order that the light-emitting diode be reliably inhibited in the short-circuited state, the effective potential difference at the light-emitting diode must be smaller than the threshold voltage of the light-emitting diode. In many instances it is therefore necessary in order to achieve this result that the feed voltages of the push-pull circuit and of the feed circuit containing the light-emitting diode be different. Such a voltage differential would, however, not normally be desired in the absence of the light-emitting diode.

SUMMARY OF THE INVENTION

It is an object of the present invention to provide a drive circuit for a light-emitting diode which does not require close attention to the dimensions of the components in the connecting line between the circuit containing the light-emitting diode and the drive circuit.

It is another object of the present invention to provide a drive circuit for a light-emitting diode wherein feed voltages of different magnitudes for the feed circuit containing the light-emitting diode and for the transistor push-pull drive circuit are not required.

The above objects are inventively achieved in a drive circuit for a light-emitting diode wherein the connecting line contains only a single diode which, upon formation of a current path proceeding via one of the two transistors in a push-pull transistor circuit, becomes connected in parallel to the feed current path for the light-emitting diode. At least one additional diode is connected in the feed circuit in series with the light-emitting diode.

In the "short-circuit case," the series connection consisting of the connecting line diode and one of the push-pull circuit transistors is switched in parallel to the series connection including the light-emitting diode and the additional diode. The voltage drop at the "short-circuit path" consisting of the series-connected additional diode and push-pull transistor amounts to approximately 1.2 through 1.4 volts. Approximately 1.3 volts are required for driving a conventional light-emitting diode and, because the additional diode requires approximately 0.7 volts in order to be driven, approximately 2 volts must be developed at the series connection consisting of the additional diode and the light-emitting diode in order to drive the light-emitting diode. Therefore, the voltage of approximately 1.3 volts at the "short-circuit path" reliably maintains the light-emitting diode in a blocked or non-conducting state.

In a further embodiment of the invention, the additional diode is disposed at the same side of the junction which connects the feed circuit and the connecting line as the light-emitting diode, and a capacitor is interconnected between the junction of the push-pull transistors and the junction between the light-emitting diode and the additional diode. A current pulse is thus generated by the capacitor at the time of switch-over of the light-emitting diode from a non-conducting to a conducting state which bypasses the connecting line diode and the additional diode, so that the pulse is superimposed on the normal feed current for the light-emitting diode when the push-pull transistor circuit is switched. As a result of the brief excess current produced in this manner, the time span between the switching of the push-pull circuit and the point in time when the maximum light emission by the light-emitting diode begins is significantly shortened.

BRIEF DESCRIPTION OF THE DRAWING

The single figure shows a drive circuit for at least one light-emitting diode constructed in accordance with the principles of the present invention.

DESCRIPTION OF THE PREFERRED EMBODIMENTS

As shown in the drawing, a drive circuit for at least one light-emitting diode 6 has a push-pull transistor circuit consisting of transistors 1 and 2 of the same conductivity type. The transistors 1 and 2 have respective control electrodes 3 and 4, which may be the base leads for those transistors. The transistors are driven by anti-phase signals such that either the transistor 1 or the transistor 2 is in a non-conducting or blocking state and at that time the other transistor is conducting, forming a low-resistance via its collector-emitter path.

As further seen in the drawing, the light-emitting diode is connected in a feed circuit 5 which also contains a resistor 7 and an additional diode 8 and which is connected between the positive pole of a voltage source and the negative pole of the voltage source at ground. The dimensioning of the additional diode 8 and the resistor 7 in the feed circuit 5 are selected such that the maximum feed current for the light-emitting diode 6 is not exceeded. A connecting line 10 is interconnected between a junction 11 of the push-pull transistor circuit and a junction 12 of the feed circuit 5. The connecting line 10 contains a diode 9. The diode 9 and the collector-emitter path of the transistor 2 thus form a "short-circuit path" for the light-emitting diode 6 and the additional diode 8 when the transistor 1 is in a non-conducting state and the transistor 2 forms a low-resistance via its collector-emitter path. The voltage drop across the series connection consisting of the diode 9 and the transistor 2 is too low to drive the diode 8 and the light-emitting diode 6, so that the light-emitting diode 6 is therefore currentless and cannot emit light.

When the transistor 2 is switched to a non-conducting or blocking state and the transistor 1 forms a low-resistance with its collector-emitter path, the diode 9 then becomes non-conducting and the feed voltage from the feed circuit is connected across the series connection consisting of the additional diode 8 and the light-emitting diode 6, so that the light-emitting diode 6 is now driven with its feed current limited by the resistor 7. In this state, the light-emitting diode 6 emits light.

In order to improve the cut-in operation of the diode 6, a capacitor 14 may be interconnected between the junction 11 of the two transistors 1 and 2 of the push-pull circuit and the junction 13 between the additional diode 8 and the light-emitting diode 6. An additional feed circuit for the light-emitting diode 6 is thus briefly formed via the capacitor 14, proceeding from the positive pole of the feed voltage source which is connected to the collector of the transistor 1, over the collector-emitter path of the transistor 1 when the transistor 1 is switched from a blocking state to a conducting state. This capacitor cut-in current pulse is superimposed on the current supplied by the voltage source to the feed circuit 5. The brief excess current for the diode 6 developed in this manner shortens the time span required by the light-emitting diode 6 to reach a condition of maximum light emission, but is too short to overload the light-emitting diode 6.

After the switchover of the light-emitting diode 6 to a conducting state is concluded, the light-emitting diode 6 continues to draw feed current only via the feed circuit 5 which, as stated above, is dimensioned such that the light-emitting diode 6 is not overloaded.

When the transistor 1 again is switched to a non-conducting state, the collector-emitter path of the transistor 2 simultaneously becomes conducting and the series connection of the diode 9 and the transistor 2 is again switched in parallel to the series connection of the additional diode 8 and the light-emitting diode 6. The series connection of the additional diode 8 and the light-emitting diode 6 is thereby disconnected from the feed current and the light-emitting diode 6 again has no current supplied to it and therefore does not emit light.

Although modifications and changes may be suggested by those skilled in the art it is the intention of the inventors to embody within the patent warranted hereon all changes and modifications as reasonably and properly come within the scope of their contribution to the art.

We claim as our invention:

1. In a drive circuit for driving at least one light-emitting diode, said light-emitting diode being connected in series with an additional diode which is connected to a source of operating potential through a resistor, said light-emitting diode also connected to a transistor push-pull circuit containing two transistors connected at a junction, the improvement comprising:

a connecting diode interconnected between the junction of said resistor and said additional diode and the junction of said two transistors in said transistor push-pull circuit for forming a path to ground with one of said transistors in said push-pull circuit in parallel with said light-emitting diode and said additional diode such that no current is supplied to said light-emitting diode;

said additional diode supplying current to said light-emitting diode when said one of said transistors in said push-pull circuit is non-conducting.

2. The improvement of claim 1 further comprising:

a capacitor interconnected between the junction of said additional diode and said light-emitting diode and the junction of said two transistors in said push-pull circuit for generating a current pulse upon switchover of said light-emitting diode to a conducting state.

* * * * *